United States Patent
Schaefer

(10) Patent No.: US 12,066,891 B2
(45) Date of Patent: Aug. 20, 2024

(54) REAL TIME SYNDROME CHECK

(71) Applicant: Micron Technology, Inc., Boise, ID (US)

(72) Inventor: Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 17/820,085

(22) Filed: Aug. 16, 2022

(65) Prior Publication Data

US 2023/0061144 A1 Mar. 2, 2023

Related U.S. Application Data

(60) Provisional application No. 63/236,962, filed on Aug. 25, 2021.

(51) Int. Cl.
*G06F 11/10* (2006.01)
*G06F 11/07* (2006.01)
*G11C 7/10* (2006.01)

(52) U.S. Cl.
CPC ...... *G06F 11/1068* (2013.01); *G06F 11/0772* (2013.01); *G11C 7/1069* (2013.01)

(58) Field of Classification Search
CPC . G06F 11/1068; G06F 11/0772; G11C 7/1069
See application file for complete search history.

(56) References Cited

U.S. PATENT DOCUMENTS

| | | | | |
|---|---|---|---|---|
| 5,832,031 A | * | 11/1998 | Hammons, Jr. | H04L 1/0057 714/775 |
| 7,526,713 B2 | * | 4/2009 | Klein | G06F 11/106 714/763 |
| 2005/0289444 A1 | * | 12/2005 | Klein | G11C 11/4096 714/793 |
| 2009/0327800 A1 | * | 12/2009 | Kim | G06F 11/1044 714/5.11 |
| 2015/0067446 A1 | * | 3/2015 | Yen | H03M 13/3723 714/768 |
| 2015/0293813 A1 | * | 10/2015 | Lin | H03M 13/05 714/764 |
| 2016/0011934 A1 | * | 1/2016 | Hsu | G06F 11/1012 714/764 |
| 2021/0089390 A1 | * | 3/2021 | Lee | G06F 7/5443 |

* cited by examiner

*Primary Examiner* — Guy J Lamarre
(74) *Attorney, Agent, or Firm* — Holland & Hart LLP

(57) ABSTRACT

Methods, systems, and devices for memory operations are described. A read command may be received at a memory device from a host device. As part of an error control operation, a first set of error control bits may be generated for the set of data. Based on the first set of error control bits, a failure of a matching operation associated with the error control operation may be determined. Based on determining the failure of the matching operation, a second set of error control bits that is different than the first set of error control bits may be transmitted to the host device. The second set of error control bits may indicate that the matching operation failed at the memory device.

35 Claims, 7 Drawing Sheets

REAL TIME SYNDROME CHECK

CROSS REFERENCE

The present application for patent claims the benefit of U.S. Provisional Patent Application No. 63/236,962 by SCHAEFER, entitled "REAL TIME SYNDROME CHECK," filed Aug. 25, 2021, assigned to the assignee hereof, and expressly incorporated by reference herein.

FIELD OF TECHNOLOGY

The following relates generally to one or more systems for memory and more specifically to real time syndrome check.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
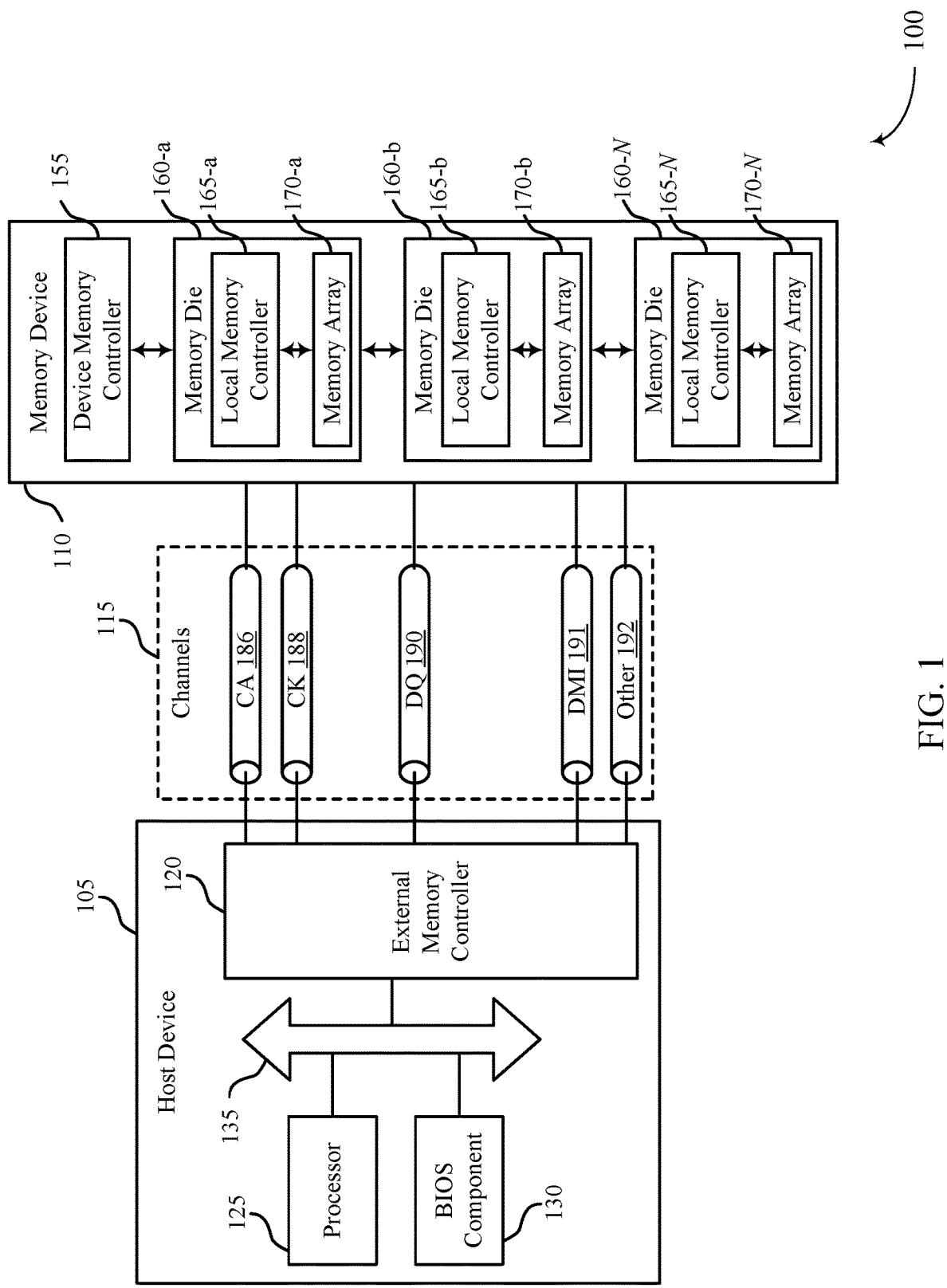
FIG. 1 illustrates an example of a system that supports real time syndrome check in accordance with examples as disclosed herein.

A memory device may store data for a host device, which may access the stored data at a later time. In some examples, a failure may occur when data is communicated between the host device and the memory device. In some examples, a failure may occur when a host device treats invalid data received from (or determined as being received from) a memory device as valid data. An acceptable failure rate associated with storing and accessing the data stored at a memory device may be based on the consequences of a failure—for example, an acceptable failure rate of a system used in autonomous vehicles may be stricter than for other applications, such as desktop computing.

For safety applications, enhanced techniques may be used to decrease a failure rate associated with a memory device. Error management signaling may be communicated between a memory device and host device to reduce a quantity of failures. The error management signaling may include a valid operation signal (e.g., a valid read operation flag (VROF) signal), a syndrome check signal, a master error log signal, a link error correction code (ECC) signal, or any combination thereof. In some examples, a subset of available protocols for communicating data between a host device and memory device may support the communication of one or more of the supplemental error management signals.

A host device may use a protocol that does not support communicating one or more of the valid operation signal, the syndrome check signal, or the master error status signal—though, in some examples, the memory device may still generate the underlying data for the signals. For example, some such memory systems may implement a communication protocol (e.g., a special function select protocol, such as a DSF+ protocol) that includes a dedicated interval or set of bits for indicating that the master error log includes information for a host device. However, other memory systems may not implement a communication protocol that includes the dedicated interval or set of bits. Thus, a host device may be unable to exchange supplemental error management signaling with a memory device if it does not implement some protocols. For example, the host device may be unable to receive a syndrome check signal, and thus, may be unable to determine a result of syndrome check operation performed at the memory device. Accordingly, communication errors between the memory device and host device may increase (e.g., if the host device uses invalid data obtained based on erroneously correcting a set of data that includes a multi-bit error after determining that the set of data includes a single-bit error). Thus, a failure rate associated with the memory device may also increase, and, in some cases, may exceed a threshold.

To enable syndrome check information to be communicated when a protocol that does not support explicitly communicating syndrome check information is used, the syndrome check information may be encoded into signaling that is supported by the protocol (e.g., an existing or standardized protocol, such as a link ECC protocol). In some examples, the syndrome check information may be encoded into an error management signal that is used to protect against errors that may occur during the transmission of data (which may also be referred to as a link error management signal). For example, a result of a syndrome check may be indicated by transmitting a particular value during a duration for transmitting the link error management signal. Such particular values may be used in place of a set of bits that was otherwise generated for transmitting the link error management signal. The particular value may indicate to a host device that a syndrome check failed at the memory device—e.g., that the syndrome bits stored for the requested set of data when written to the memory device do not match the syndrome bits computed for the requested set of data when retrieved from the memory device.

By transmitting a particular value in a link error management signal with a set of data that indicates a syndrome check failure (which may also be referred to as a syndrome check fault) in place of a value of a parity check generated for the set of data, a host device may detect syndrome check failures at the memory device without an explicit syndrome check signal being used.

Features of the disclosure are initially described in the context of systems. Features of the disclosure are also described in the context of a signal diagram and process flow. These and other features of the disclosure are further illustrated by and described with reference to an apparatus diagram and flowcharts that relate to real time syndrome check.

FIG. 1 illustrates an example of a system 100 that supports real time syndrome check in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general-purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, CK channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, DQ channels 190 may be operable to communicate one or more of data or control information between the host device 105 and the memory device 110. For example, the DQ channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the one or more other channels 192 may include one or more error management channels, which may be referred to as error control channels, error detection code channels, or ECC channels. The error management channels may be operable to communicate error detection signals, such as checksums, to improve system reliability. An error management channel may include any quantity of signal paths.

A package may be used to contain and provide access to and from a memory device 110. The package may include pins that give access to and from components within the memory device 110 (e.g., a memory controller, such as a device memory controller 155 or a local memory controller 165, a memory die, such as a memory die 160). In some examples, the package may include DQ pins that allow data to be input to or output from the memory controller. Also, the package may include a write clock (WCK) pin that is used to receive a WCK signal from a host device 105—the WCK signal may be received when a read or write command is issued by the host device 105 and may be used for sampling a data signal received on the DQ pins at the memory device 110. Also, the package may include a read data strobe (RDQS) pin that is used to output a clock signal (which may also be referred to as an RDQS signal)—e.g., when the memory device 110 is configured to operate using a frequency that falls within a range of frequencies. In some examples, the memory device 110 generates the RDQS signal based on the received WCK signal, and a host device 105 may use the RDQS signal for sampling a received data signal. Also, the package may include a data mask inversion (DMI) pin that is used to output error management information—e.g., information for detecting and/or correcting errors. In some examples, a package may similarly be used to contain and provide access to and from a host device 105.

The pins of the package may also be coupled with a bus that includes multiple channels 115. In some examples, the DQ pins of the memory device 110 may be coupled with the DQ channel 190, the RDQS pin may be coupled with a CK channel 188 of the bus, and the DMI pin may be coupled with a DMI channel 191 of the bus. In some examples, the pins of the package and/or the channels 115 of the bus may be terminated (e.g., weakly) to a voltage source or voltage sink (e.g., a ground reference). For example, the DQ pins and/or the DQ channel 190 may be terminated to a ground reference—e.g., via an impedance. Thus, when the bus is not being used (e.g., is in an idle, inactive, or floating state), the voltage of the pins and channels 115 may trend toward the voltage of a coupled voltage source or voltage sink. In some examples, the pins of the package and/or the channels 115 may not be coupled with a voltage source or voltage sink when the bus in not being used—e.g., may be in a floating state. Alternatively, when the bus is being used (e.g., is in an active state) by either the memory device 110 or the host device 105, the voltage of the channels 115 may be driven by the memory device 110 or the host device 105.

Communications between host device 105 and memory device 110 may fail. A failure may include a scenario where a host device 105 receives invalid data from a memory device 110 without determining that the data is invalid. In such cases, the host device 105 may use the invalid data to perform an operation. A failure rate for a system 100 that includes a host device 105 and memory device 110 may be determined by testing multiple similarly-constructed systems for a time interval and determining a quantity of failures that occur per aggregate hour—e.g., if one hundred systems are tested for one hundred hours, the failure rate may determine a quantity of failures that occur in around 10,000 hours. The testing may yield a quantity of failures expected to occur in one billion hours of operation for the system, which may also be referred to as a failure in time (FIT) rate. The system may be configured to have an acceptable FIT rate—e.g., a FIT rate that is below a threshold. The threshold may be set based on the ramifications of a failure. For example, the more severe an injury that may result from a failure, the stricter the FIT rate may be—e.g., the threshold value may be lower (e.g., less than 4 FITs) if the system is deployed in an application used to operate an automobile (e.g., in an autonomous vehicle).

A failure rate of a system may be affected by a type of packaging used for a memory device 110—e.g., a failure rate may increase as a footprint of the packaging decreases or a density of the packaging is increased, or both, and vice versa. In some examples, changing a package used to contain a memory device 110 may cause the FIT rate for a system 100 (that previously satisfied a FIT rate threshold when the memory device 110 was packaged in a prior package) to exceed the FIT rate threshold when the memory device 110 is packaged in a current package—e.g., due to an increased quantity of mechanical failures that may occur, such as soldering failures or shorting scenarios. For example, packaging a memory device 110 in a fine-pitch ball grid array may cause the FIT rate for the system 100 to increase (e.g., to 25.5 FITs) relative to packaging the memory device 110 in a ball grid array having a larger pitch (e.g., from 2.4 FITs).

Packaging errors that cause a bus between the memory device 110 and host device 105 to improperly enter or remain in a floating state may significantly contribute to a FIT rate of a system 100. In such cases, the host device 105 may be unable to determine whether a signal on the bus is a data signal driven by the memory device 110 (which may be referred to as a valid data signal) or a random data signal that results on the bus when the bus is in a floating state (which may be referred to as an invalid data signal). Also, the host device 105 may determine that a random data signal on the bus is a valid data signal and use invalid data obtained from the random data signal to perform an operation, increasing a FIT rate for the system.

A system 100 may employ data-reliability techniques to achieve an acceptable FIT rate for a system 100. For example, the system 100 may store parity bits with data, where the parity bits may be used to detect and/or correct errors in the data when the data is output to a host device 105. In some examples, the parity bits may be used to generate one or more syndrome bits that indicate which bits in a data packet are defective.

Error protection may be applied to a link between the memory device 110 and the host device 105 (e.g., to data transmitted over DQ channel 190). Such error protection may be referred to as link ECC. In such cases, parity information may be generated for data that is to be transmitted to the host device 105, or vice versa. The parity information may then be transmitted with a set of data during a corresponding read operation. The receiving device may use the parity information to determine whether any errors were introduced into the set of data during the transmission of the set of data and, in some examples, to correct detected errors.

A memory device 110 and/or a host device 105 may include a syndrome check circuit. A syndrome check circuit at a memory device 110 may check syndrome bits associated with a set of data and generate an indication (which may be referred to as the syndrome check signal) for a host device 105 that indicates whether there is an error in the data—e.g., if the syndrome bits include any non-zero syndrome bits. In some examples, the memory device 110 transmits the syndrome check signal to the host device 105 during a corresponding read operation. Thus, the syndrome check signal may enable a host device 105 to quickly identify whether received data includes one or more errors. The syndrome check circuit may also be configured to indicate additional information such as a quantity of errors, phantom errors, a type of error, and the like. In some examples, the memory device 110 also signals the syndrome bits used to generate the syndrome check signal to the host device 105—e.g., the memory device may use the syndrome bits as parity information for the link ECC.

The host device 105 may use the syndrome bits to detect and/or correct one or more errors in the received data. In some examples, the host device 105 may compare the received syndrome bits with the syndrome bits computed for the received data to detect (and, in some examples, correct) errors in the received data. In some examples, the error management information provided by the syndrome check signal, in combination with the error management information determined using the link ECC, may be used to decrease the likelihood of a host device 105 attempting to correct and use received data having multiple bit errors (based on detecting from the link ECC that the data has a single bit error). Thus, a host device 105 may use the information to avoid failures that would otherwise contribute to the FIT rate.

The memory device 110 may also include a master error circuit to improve a reliability of data transfer. The master error circuit may enable a memory device 110 to identify errors caused by the memory controller. For example, the master error circuit may identify errors that occur when a memory device 110 writes different data to memory than what is received or outputs different data to a host device 105 than what is stored in memory—e.g., by accessing an incorrect row when writing to or reading from memory.

To reduce a FIT rate of a system caused by failing to detect an idle bus (e.g., due to bus packaging failures), a memory device 110 may use a control signal (which may be referred to as a valid read operation flag (VROF) signal) to indicate when a bus that connects the memory device 110 and a host device 105 is in an idle state (e.g., a floating state) or when the bus is in an active state. That is, the valid read operation flag may be used to indicate whether a read operation is currently being performed by the memory device 110 (e.g., using a high voltage) or that no valid read operation is currently being performed (e.g., using a low voltage). Thus, in some examples, a host device 105 may discard decoded data after determining that the corresponding data signal was obtained from an idle bus (e.g., a floating bus) based on receiving a VROF signal.

In some examples, the VROF signal, syndrome check signal generated by the syndrome check circuit, a syndrome bit signal including the syndrome bits, the master error status signal generated by the master error circuit, or any combination thereof, may be outputted on the DMI pin. The memory device 110 may include a multiplexer that may be used to switch between the VROF signal, the syndrome check signal, the master error status signal, and the link ECC signal.

A first protocol may be used that enables the error management information to be communicated between a memory device 110 and host device 105—the protocol may be referred to as a DSF+ protocol. In such examples, during a first unit interval of a read operation, a VROF signal may be outputted on the DMI pin; during a next set of unit intervals of the read operation, the syndrome check signal may be outputted on the DMI pin; during a following set of unit intervals of the read operation, the master error status signal may be outputted on the DMI pin, and, during a subsequent set of unit intervals of the read operation, the link ECC signal may be outputted on the DMI pin. Concurrently, the data associated with the read operation may be transmitted over the DQ pins during each of the unit intervals. In some examples, a second protocol may be used that enables a portion of the error management information to be communicated between a memory device 110 and host device 105—e.g., a VROF signal may not be transmitted during the first unit interval of a read operation, but the other error management signals may be transmitted during the subsequent unit intervals when the second protocol is enabled, for example, during the same sets of unit intervals as for the first protocol. The second protocol may be referred to as a DSF+ protocol. In some examples, a third protocol may be used that enables a smaller portion of the error management information to be communicated between a memory device 110 and host device 105—e.g., only the link ECC signal may be transmitted during a read operation, for example, during the same set of unit intervals as for the first and second protocols.

In some examples, the unit intervals may be determined based on a read clock signal outputted on the RDQS pin, where each unit interval corresponds to the duration between a falling edge of the read clock and a subsequent rising edge of the read clock. The read clock may be aligned with the outputting of data packets on the DQ pins. In some examples, the read clock is output by the memory device 110 when the memory device 110 is operated within a particular frequency range. When operating outside of the frequency range, the memory device 110 may not output the read clock signal. In such cases, the unit intervals may be determined based on a write clock signal generated at the host device 105. In some examples, the RDQS signal may be generated using differential signals that correspond to a write clock signal received from the host device 105—e.g., an inverted and non-inverted version of the write clock signal (which may be referred to as a differential strobe technique). In other examples, the RDQS signal may be generated using the non-inverted version of a write clock signal received from the host device 105 (which may be referred to as a single-ended strobe technique).

A host device 105 may use a protocol that does not support communicating one or more of the valid operation signal, the syndrome check signal, or the master error status signal—though, in some examples, the memory device 110 may still generate the underlying data for the signals. Thus, a host device 105 may be unable to receive supplemental error management signaling from a memory device 110. For example, the host device 105 may be unable to receive a syndrome check signal, and thus, may be unable to determine a result of syndrome check operation performed at the memory device 110. Accordingly, communication errors between the memory device 110 and host device 105 may increase (e.g., if the host device 105 uses invalid data obtained based on erroneously correcting a set of data that includes a multi-bit error after determining that the set of data includes a single-bit error). Thus, a failure rate associated with the memory device may also increase, and, in some examples, may exceed a threshold.

To enable syndrome check information to be communicated when a protocol that does not support explicitly communicating syndrome check information is used, the syndrome check information may be encoded into signaling that is supported by the protocol. In some examples, the syndrome check information may be encoded into an error management signal that is used to protect against errors that may occur during the transmission of data (which may also be referred to as a link error management signal). For example, a result of a syndrome check may be indicated by transmitting a particular value during a duration for transmitting the link error management signal—e.g., in place of a set of bits that was otherwise generated for transmitting the link error management signal. In some examples, the particular value may indicate to a host device that a syndrome check failed at the memory device—e.g., that the syndrome bits stored for the requested set of data when written to the memory device do not match the syndrome bits computed for the requested set of data when retrieved from the memory device.

In some examples, a memory device 110 may implement a communication protocol (e.g., a special function select protocol, such as a DSF+ protocol) that includes a dedicated interval for indicating that the syndrome check failed. However, in other examples, the memory device 110 may not implement a communication protocol that includes the dedicated interval.

Figure 2:
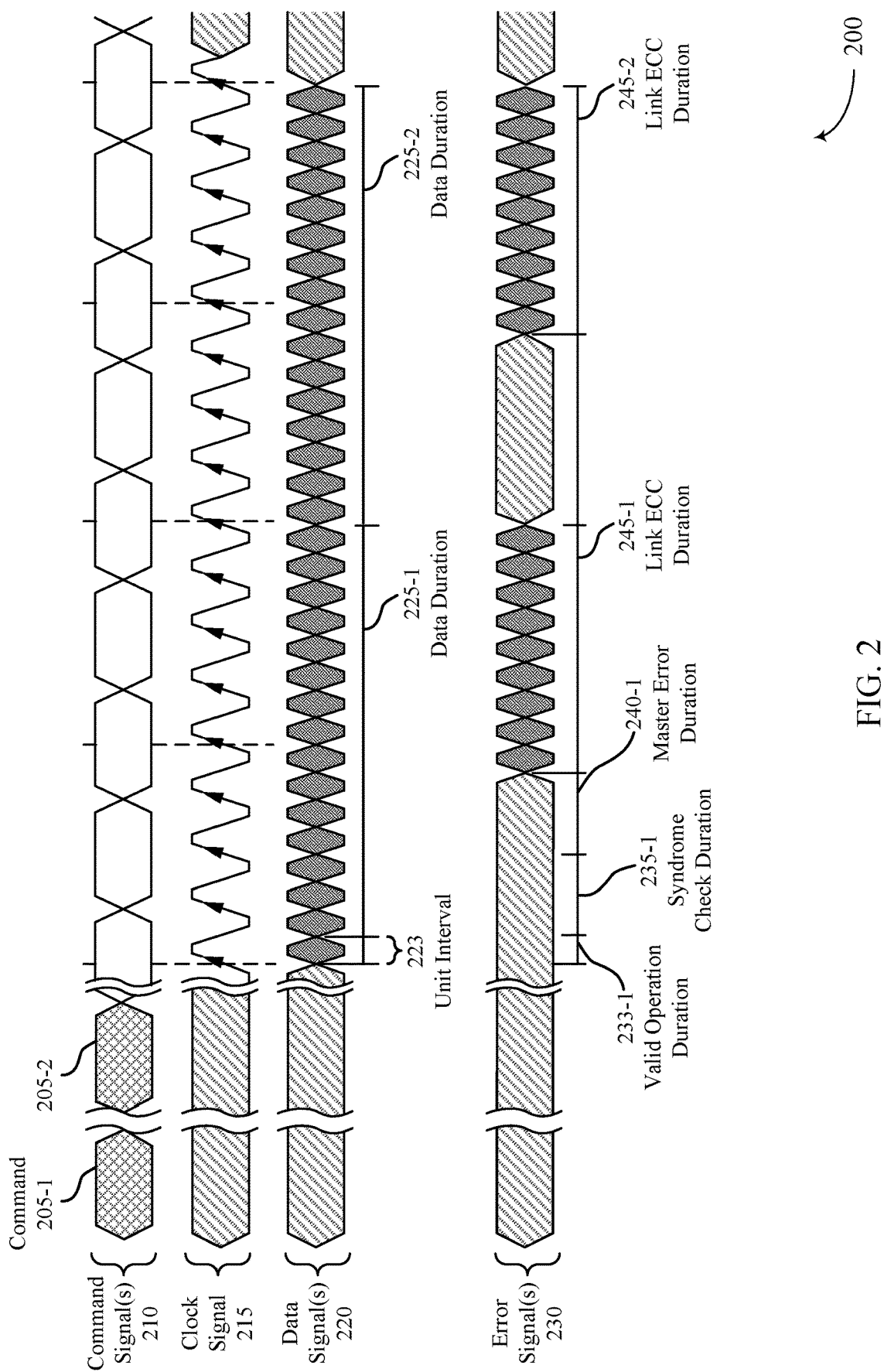
FIG. 2 illustrates an example of a signal diagram that supports real time syndrome check in accordance with examples as disclosed herein.

FIG. 2 illustrates an example of a signal diagram that supports real time syndrome check in accordance with examples as disclosed herein.

Signal diagram 200 depicts representations of a set of signals being transmitted during a time interval. Signal diagram 200 includes a representation of one or more command signals 210, a clock signal 215, one or more data signals 220, and one or more error signals 230. In some examples, command signals 210 may be communicated over a command/address channel (such as CA channel 186 of FIG. 1). Clock signal 215 may be communicated over a clock channel (such as CK channel 188 of FIG. 1). Data signals 220 may be communicated over a data channel (such as DQ channel 190 of FIG. 1). And error signals 230 may be communicated over an error management channel (such as DMI channel 191 of FIG. 1).

Commands 205 may be received in command signal 210. Among other types of commands, commands 205 may be read commands, write commands, or a combination thereof. Commands 205 may trigger data to be transmitted in data signal 220. In some examples, first command 205-1 triggers data to be transmitted during first data duration 225-1. First command 205-1 may also trigger clock signal 215 to be generated. Clock signal 215 may be an RDQS clock signal. In some examples, clock signal 215 is used to designate unit intervals 223, where a unit interval may span a duration between a rising edge and falling edge of a clock pulse. In some examples, new sets of information (e.g., sets of data, error management bits, etc.) may be transmitted each unit interval. In some examples, a WCK signal is received before a command 205 is received, where a beginning of the WCK signal may indicate that a command 205 is forthcoming. In some examples, the RDQS clock is generated based on the WCK signal. A period between receiving a WCK signal and receiving a command may be referred to as a qualified time.

Error management information may be communicated with data to enable the detection and correction of errors in the data. In some examples, the error management information may be transmitted during corresponding duration. For example, a valid operation flag (e.g., a VROF) may be transmitted during first valid operation duration 233-1, a syndrome check signal may be transmitted during first syndrome check duration 235-1, a master error status may be transmitted during first master error duration 240-1, and an error correction code (e.g., parity bits) may be transmitted during first link ECC duration 245-1. First valid operation duration 233-1 may span a first unit interval of first data duration 225-1, first syndrome check duration may span a next three unit intervals of first data duration 225-1, first master error duration 240-1 may span a following three unit interval of first data duration 225-1, and first link ECC duration may span the following nine unit intervals of first data duration 225-1.

One or more of a valid operation signal, syndrome check signal, or master error status signal may not be communicated—e.g., if a configured communication protocol does not support communication of such error management signaling. For example, a VROF signal may not be transmitted during a valid operation duration 233, which may correspond to a first unit interval of a data duration 225. Additionally, or alternatively, a syndrome check signal may not be transmitted during first syndrome check duration 235-1. In such cases, a voltage of error signal 230 may be at a first voltage level during valid operation durations 233, syndrome check durations 235, master error durations 240, or a combination thereof, when a DMI pin is not being driven—e.g., based on a termination of the DMI pin to a voltage source or voltage sink providing the first voltage level. Or at an indeterminate voltage level—e.g., if the DMI pin is in a floating state when the DMI pin is not being driven.

When a syndrome check signal is not transmitted, a host device may not receive an indication of whether a set of syndrome bits stored for a set of data when written and a set of syndrome bits computed for the set of data when retrieved do not match. This indication may be used by a host device to determine whether a detected error in a set of data is a single-bit error (which may be corrected using parity bits associated with the set of data) or a multi-bit error (which may be uncorrectable). Without this indication, the host device may incorrectly determine, for a set of data that has a multi-bit error, that the set of data has a single-bit error. In such cases, the host device may perform an operation for correcting the single-bit error based on a set of syndrome bits generated for the set of data and use the corrected, though still invalid, set of data, resulting in a failure.

As described herein, in some examples, to enable a host device to determine whether a syndrome check failure for a requested set of data occurred, the memory device may transmit a particular value (e.g., 11011011) during a link ECC duration 245 in place of a set of ECC bits computed for a corresponding set of data. In such cases, the host device may be configured to determine that a syndrome check failure occurred based on receiving the particular value during the link ECC duration 245—e.g., instead of using the value of the set of bits received for the detection, and, in some examples, correction of errors in a corresponding set of data.

Figure 3:
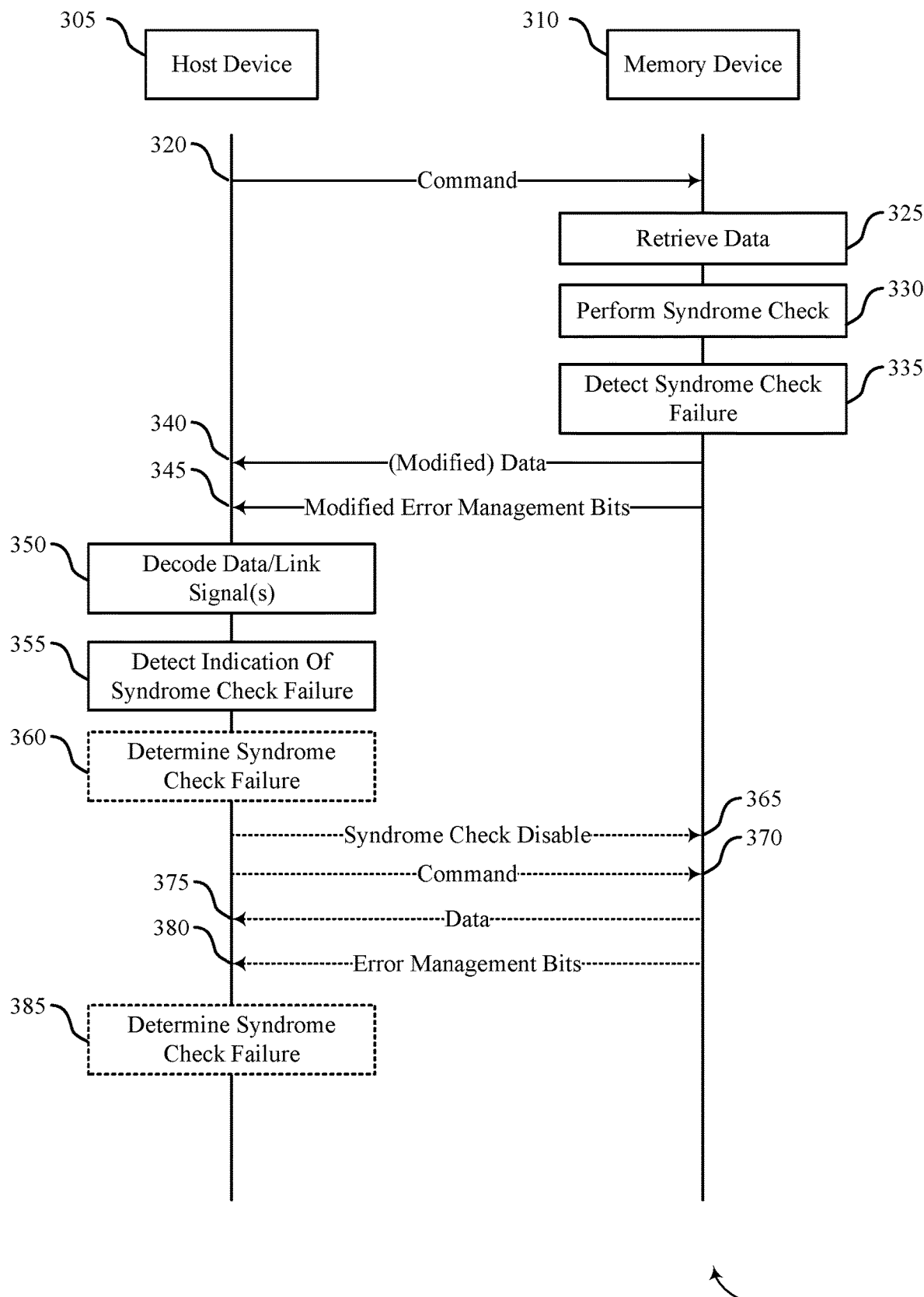
FIG. 3 illustrate example sets of operations that support real time syndrome check in accordance with examples as disclosed herein.

FIG. 3 illustrates an example of a process flow that supports real time syndrome check in accordance with examples as disclosed herein.

Process flow 300 may be performed by host device 305 and memory device 310, which may be respective examples of a host device and memory device described above with reference to FIGS. 1 and 2. In some examples, process flow 300 illustrates an example sequence of operations performed to support a real time syndrome check. For example, process flow 300 depicts operations for indicating a syndrome check failure by transmitting a particular error correction code (e.g., "11011011") to during a link ECC duration.

The operations described in process flow 300 may be performed earlier or later in the process, omitted, replaced, supplemented, or combined with another operation. Also, additional operations described herein that are not included in process flow 300 may be included.

At arrow 320, host device 305 may transmit a command to memory device 310. In some examples, the command is a read command and addresses a location in a memory array of memory device 310 storing a set of data.

At block 325, memory device 310 may retrieve a set of data addressed by the command based on receiving the command. Retrieving the set of data may include decoding the logic states stored by a set of memory cells at the addressed location.

At block 330, memory device 310 may perform a syndrome check based on the retrieved set of data. In some examples, memory device 310 may retrieve a first set of error management bits that were generated (in some examples, the first set of error management bits may be referred to as syndrome bits) when a stored set of data associated with the retrieved set of data was written to memory device 310 and stored in memory device 310. Memory device 310 may also generate a second set of error management bits based on the retrieved set of data. In some examples, the retrieved set of data may be different than the stored set of data—e.g., due to internal storage errors, such as bit flipping. In some examples, the memory device 310 may use the second set of error management bits as link ECC bits. In other examples, a third set of error management bits may be computed for the link ECC bits—e.g., based on a corrected version of the set of data.

Memory device 310 may compare the first set of error management bits with the second set of error management bits. In some examples, memory device 310 may determine that the first set of error management bits are different than the second set of error management bits—e.g., if the stored set of data bits is different than the retrieved set of data bits.

At block 335, memory device 310 may detect a syndrome check failure based on the result of the syndrome check operation indicating that the error management bits are different. In some examples, memory device 310 may generate a modified set of error management bits that has a particular value (e.g., having a value 11011011) based on determining that the syndrome check operation failed. The modified set of error management bits may be transmitted using a link ECC resources instead of the error management bits generated for the retrieved set of data. In some examples, the modified set of error management bits may be referred to as a code or a syndrome check failure code.

In some examples, the modified set of error management bits may be selected from a set of error management bits associated with non-aliasing errors, such as non-bit flipping error codes. A set of error management bits associated with an aliasing error, such as bit flipping error codes, may be a set of error management bits that may result in a single-bit "correction" of a set of data that includes multiple bit errors—such a correction may not actually correct the set of data but may be cause the set of data to be determined as valid. In some examples, the bit flipping error codes may be indicative of single-bit/aliasing errors. While the non-bit flipping error codes may be associated with multiple-bit/ non-aliasing errors, where the multiple bit errors may be uncorrectable. In some examples, a first set of values is associated with the bit flipping error codes (e.g., in decimal: 24-31, 40-63, 72-103, 152-183, 192-215, and 224-231) and a second set of values is associated with the non-bit flipping error codes (e.g., in decimal: 1-23, 32-39, 64-71, 104-151, 184-191, 216-223, and 232-255). In some cases, the particular value of the error management bits is selected from the second set of values (e.g., in binary: 11011011, 11111111, etc.). In some examples, the value 11111111 is not selected as the particular value—e.g., if the value is reserved to indicate other information, such as a no-drive condition.

At arrow 340, memory device 310 may transmit the retrieved set of data to host device 305. In some examples, memory device 310 may transmit a modified set of data based on detecting the syndrome check failure—e.g., a value of the modified set of data may include all 1's (e.g., "11111111") or all 0's (e.g., "00000000"). The modified set of data may be used to indicate additional information for host device 305 to detect the occurrence of a syndrome check failure.

At arrow 345, memory device 310 may transmit the modified set of error management bits to host device 305. In some examples, memory device 310 may append a double error detection (DED) bit may to the modified set of error management bits. The DED bit may be used to indicate whether the bits composing the data and error management bits (e.g., the modified error management bits) include an odd or even quantity of 1's. That is, the DED bit may be a parity bit for an aggregation of the data bits and error management bits.

Memory device 310 may compute a DED bit based on the transmitted set of data and the modified error management bits. In some examples, as a further indication that a syndrome check failure occurred, memory device 310 may invert the value of the DED bit that results from computing the DED bit.

At block 350, host device 305 may decode the received data signals and link ECC signals. Host device 305 may obtain a set of data bits based on the data signals and a set of error management bits based on the link ECC signals. The set of data bits may correspond to the retrieved set of data bits and the set of error management bits may correspond to the modified set of error management bits—e.g., if not errors occurred during transmission.

At block 355, host device 305 may detect an indication that a syndrome check failure occurred at memory device 310—e.g., based on determining that a value of the received error management bits is equal to a particular value (e.g., 11011011).

In other examples, host device may not detect an indication that a syndrome check failure occurred at memory device 310—e.g., based on determining that a value of the received error management bits is equal to a value other than the particular value. In such cases, memory device 310 may use the received error management bits for the detection, and in some examples, correction of errors in the received set of data. Using the received error management bits may include generating a set of parity bits for the received set of data and comparing the generated set of parity bits with the received set of parity bits to determine if there is a match. A match may indicate that no errors occurred during transmission. A mismatch may indicate that one or more errors occurred during transmission. When one error is detected, host device 305 may determine a location of the error based on a result of matching (e.g., XOR'ing) the generated and received error management bit and invert the bit at the determined location. When multiple errors are detected, host device 305 may determine the error is uncorrectable and discard the data.

At block 360, host device 305 may determine that a syndrome check failure occurred. In some examples, host device 305 may determine that a syndrome check failure occurred based solely on determining that the received set of error management bits has the particular value (that is, the syndrome check failure code).

In some examples, host device 305 may determine that a syndrome check failure occurred based on a value of the DED bit transmitted with the received error management bits. That is, based on determining that the received set of error management bits has the particular value, host device 305 may compute a DED bit based on an aggregation of the received set of data bits and the received set of error management bits. Host device 305 may compare the computed DED bit with the received DED bit, and, if the computed DED and received DED bit have different value, determine that a syndrome check failure occurred. Otherwise, if the value of the computed DED bit matches the received DED bit, host device 305 may determine that the received set of error management bits are to be used for the detection of errors in the set of data.

In some examples, based on determining that the received set of error management bits has the particular value, host device 305 may confirm that a syndrome check failure occurred by performing the operations described at arrow 365 through block 385.

At arrow 365, host device 305 may transmit a command to memory device 310 to not send an indication of a syndrome check failure in using link ECC resources. In some examples, the command disables the syndrome check operation at memory device 310. In some examples, the command disables the reporting of a result of the syndrome check operation at memory device 310.

At arrow 370, host device 305 may transmit a second command to memory device 310. Like the first command transmitted at arrow 320, the second command may be a read command and may address a same location in a memory array as the first command.

At arrow 375, memory device 310 may transmit, to host device 305, a second set of data stored at the location based on receiving the second command. In some examples, the second set of data may be same as the first set of data transmitted at arrow 340.

At arrow 380, memory device 310 may transmit, to host device 305, a set of error management bits associated with the data to memory device 310. In some examples, the error management bits are parity bits for the set of data. In some examples, the error management bits are based on a result of a syndrome check performed at memory device 310 for the set of data. In some examples, the error management bits are different than the modified error management bits transmitted at arrow 345. In such cases, the error management bits may be the same as the error management bits generated for the first set of data retrieved at block 325.

At block 385, host device 305 may determine whether a syndrome check failure occurred based on the modified error management bits received at arrow 345 and the second error management bits received at arrow 380. In some examples, host device 305 determines that a syndrome check failure occurred if the modified error management bits do not match the second error management bits—e.g., because this may indicate that the error management bits received at arrow 345 were not the error management bits generated for the set of data received at arrow 340.

In examples where error management bits are sent at arrow 345 without modification, host device 305 may determine that a syndrome check failure did not occur if the previously received error management bits match the currently received error management bits—e.g., because this may indicate that the previously error management bits were generated for the same set of data as the currently received error management bits. In such cases, host device 305 may determine the received error management bits are being used for the management of errors in the received set of data (instead of as an indication of a failure of a syndrome check). In some examples, host device 305 may not use the received error management bits to correct errors but may use the received error management bits to identify an erroneous codeword in a transmission of multiple codewords. By identifying an erroneous codeword, host device 305 may request retransmission of the erroneous codeword instead of a retransmission of all of the codewords.

Figure 4:
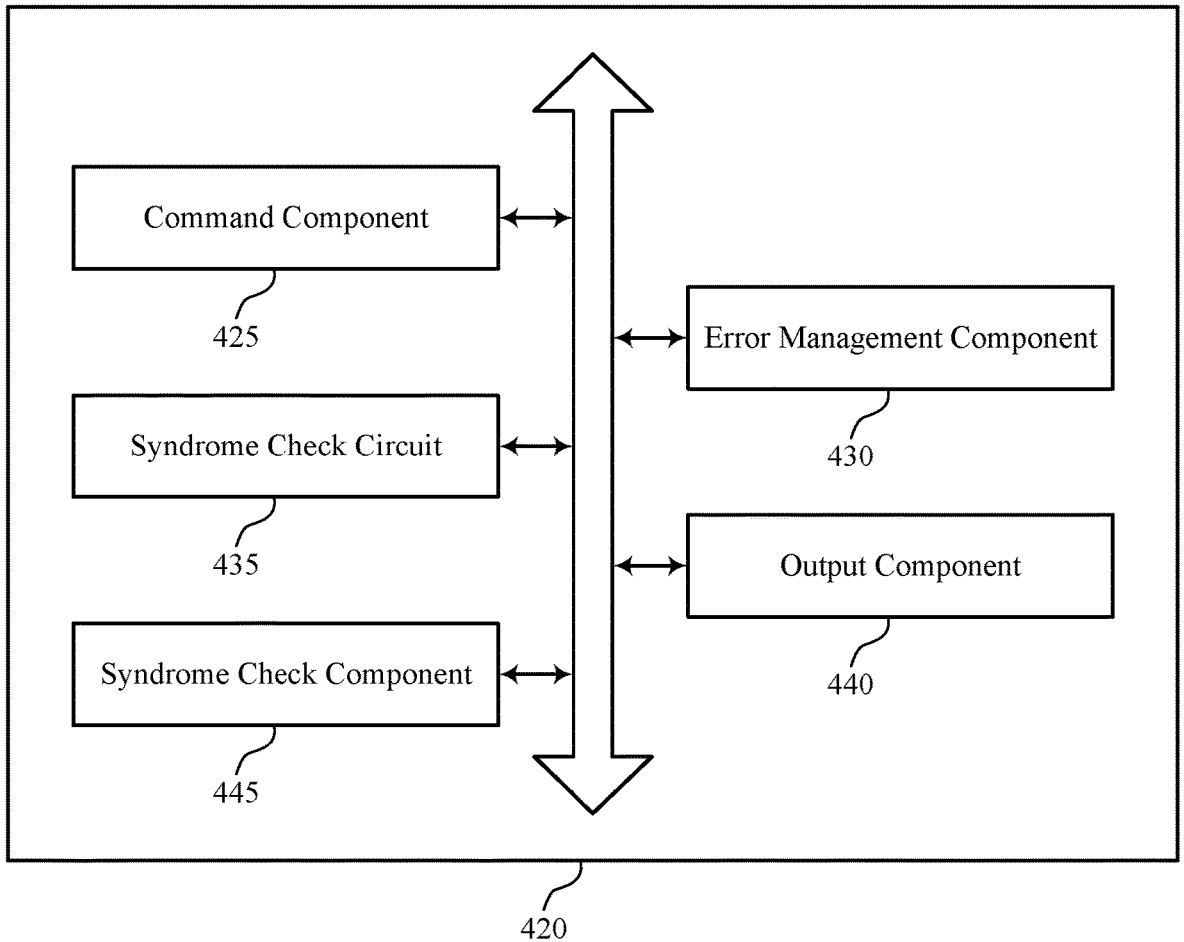
FIG. 4 shows a block diagram of a memory device that supports real time syndrome check in accordance with examples as disclosed herein.

FIG. 4 shows a block diagram 400 of a memory device 420 that supports real time syndrome check in accordance with examples as disclosed herein. The memory device 420 may be an example of aspects of a memory device as described with reference to FIGS. 1 through 3. The memory device 420, or various components thereof, may be an example of means for performing various aspects of real time syndrome check as described herein. For example, the memory device 420 may include a command component 425, an error management component 430, a syndrome check circuit 435, an output component 440, a syndrome check component 445, or any combination thereof. Each of these components may communicate, directly or indirectly, with one another (e.g., via one or more buses).

The command component 425 may be configured as or otherwise support a means for receiving, from a host device, a read command associated with a set of data. The error management component 430 may be configured as or otherwise support a means for generating, as part of an error control operation, a first set of error control bits for the set of data. The syndrome check circuit 435 may be configured as or otherwise support a means for determining that the first set of error control bits fail a matching operation associated with the error control operation. The output component 440 may be configured as or otherwise support a means for transmitting, to the host device, a second set of error control bits that is different than the first set of error control bits based at least in part on the first set of error control bits failing the matching operation.

In some examples, the syndrome check circuit 435 may be configured as or otherwise support a means for retrieving the second set of error control bits from a memory based at least in part on a failure of the matching operation, where transmitting the second set of error control bits is based at least in part on retrieving the second set of error control bits.

In some examples, to support determining that the first set of error control bits fail the matching operation, the syndrome check circuit 435 may be configured as or otherwise support a means for comparing the first set of error control bits with a third set of error control bits stored for the set of data. In some examples, to support determining that the first set of error control bits fail the matching operation, the syndrome check circuit 435 may be configured as or otherwise support a means for determining that a value of the first set of error control bits is different than a value of the third set of error control bits.

In some examples, the error management component 430 may be configured as or otherwise support a means for generating, based at least in part on a combination of the set of data and the second set of error control bits, a parity bit that indicates an even state or an odd state of the combination. In some examples, the syndrome check circuit 435 may be configured as or otherwise support a means for inverting the parity bit based at least in part on the first set of error control bits failing the matching operation. In some examples, the output component 440 may be configured as or otherwise support a means for indicating, to the host device, that the first set of error control bits fail the matching operation based at least in part on the parity bit being inverted.

In some examples, the syndrome check component 445 may be configured as or otherwise support a means for generating a second set of data based at least in part on the first set of error control bits failing the matching operation, each bit of the second set of data including a same logic value. In some examples, the output component 440 may be configured as or otherwise support a means for transmitting the second set of data based at least in part on generating the second set of data. In some examples, the output component 440 may be configured as or otherwise support a means for indicating, to the host device, that the first set of error control bits fail the matching operation based at least in part on each bit of the second set of data including the same logic value.

In some examples, the error management component 430 may be configured as or otherwise support a means for disabling a mode associated with comparing syndrome bits based at least in part on a request received from the host device, where determining that the first set of error control bits fail the matching operation is based at least in part on the mode associated with comparing the syndrome bits being enabled.

In some examples, the command component 425 may be configured as or otherwise support a means for receiving, from the host device and based at least in part on disabling the mode, a second read command associated with the set of data. In some examples, the error management component 430 may be configured as or otherwise support a means for generating, as part of a second error control operation, the first set of error control bits for the set of data. In some examples, the output component 440 may be configured as or otherwise support a means for transmitting the set of data and the first set of error control bits based at least in part on generating the first set of error control bits.

In some examples, the second set of error control bits indicates an uncorrectable error in the set of data.

In some examples, the second set of error control bits is associated with a non-aliasing error.

Figure 5:
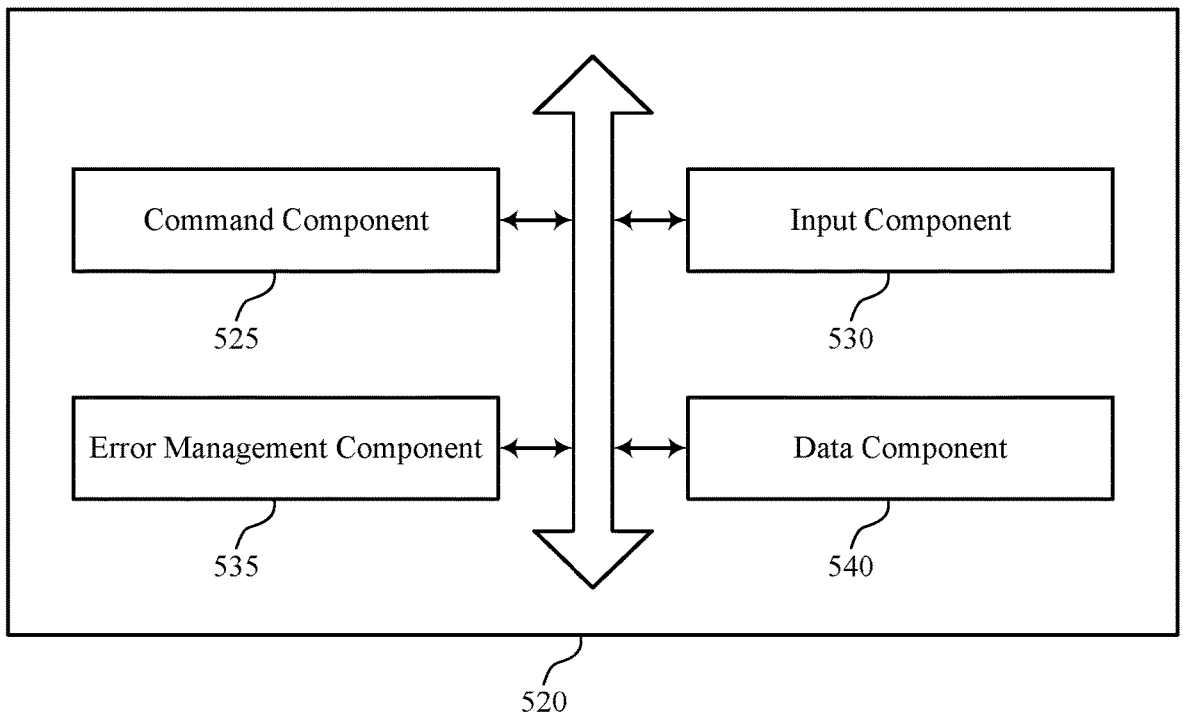
FIG. 5 shows a block diagram of a host device that supports real time syndrome check in accordance with examples as disclosed herein.

FIG. 5 shows a block diagram 500 of a host device 520 that supports real time syndrome check in accordance with examples as disclosed herein. The host device 520 may be an example of aspects of a host device as described with reference to FIGS. 1 through 3. The host device 520, or various components thereof, may be an example of means for performing various aspects of real time syndrome check as described herein. For example, the host device 520 may include a command component 525, an input component 530, an error management component 535, a data component 540, or any combination thereof. Each of these components may communicate, directly or indirectly, with one another (e.g., via one or more buses).

The command component 525 may be configured as or otherwise support a means for transmitting, to a memory device, a read command. The input component 530 may be configured as or otherwise support a means for receiving, based at least in part on transmitting the read command, a set of data and a set of error control bits. The error management component 535 may be configured as or otherwise support a means for determining that the set of error control bits fail a matching operation associated with an error control operation at the memory device based at least in part on the set of error control bits. The data component 540 may be configured as or otherwise support a means for processing the set of data based at least in part on the determining.

In some examples, to support processing the set of data, the data component 540 may be configured as or otherwise support a means for discarding the set of data based at least in part on determining that the set of error control bits fail the matching operation.

In some examples, the error management component 535 may be configured as or otherwise support a means for determining that the set of data includes an uncorrectable error based at least in part on determining that the set of error control bits fail the matching operation.

In some examples, the error management component 535 may be configured as or otherwise support a means for comparing a value of the set of error control bits with a stored value associated with the matching operation, where determining that the set of error control bits fail the matching operation based at least in part on the value of the set of error control bits matching the stored value.

In some examples, the error management component 535 may be configured as or otherwise support a means for decoding a first parity bit that indicates an even state or an odd state of a combination of the set of data and the set of error control bits. In some examples, the error management component 535 may be configured as or otherwise support a means for generating, based at least in part on the set of data and the set of error control bits, a second parity bit associated with indicating the even state or the odd state of the combination of the set of data and the set of error control bits. In some examples, the error management component 535 may be configured as or otherwise support a means for comparing the first parity bit with the second parity bit.

In some examples, the error management component 535 may be configured as or otherwise support a means for determining that the set of error control bits fail the matching operation based at least in part on a value of the first parity bit being different than a value of the second parity bit.

In some examples, the data component 540 may be configured as or otherwise support a means for receiving the set of data based at least in part on transmitting the read command. In some examples, the error management component 535 may be configured as or otherwise support a means for determining, based at least in part on receiving the set of data, that the set of error control bits indicates an error in the set of data based at least in part on a value of the first parity bit matching a value of the second parity bit.

In some examples, the read command is associated with a second set of data stored at the memory device, and the error management component 535 may be configured as or otherwise support a means for comparing a value of the set of error control bits with a stored value. In some examples, the read command is associated with a second set of data stored at the memory device, and the data component 540 may be configured as or otherwise support a means for determining that each bit of the set of data includes a same logic value. In some examples, the read command is associated with a second set of data stored at the memory device, and the error management component 535 may be configured as or otherwise support a means for determining that the set of error control bits fail the matching operation based at least in part on the value of the set of error control bits matching the stored value and each bit of the set of data including the same logic value.

In some examples, the error management component 535 may be configured as or otherwise support a means for comparing a value of the set of error control bits with a stored value. In some examples, the error management component 535 may be configured as or otherwise support a means for determining that the value of the set of error control bits matches the stored value. In some examples, the command component 525 may be configured as or otherwise support a means for transmitting, to the memory device, a request to disable a mode associated with comparing syndrome bits.

In some examples, the command component 525 may be configured as or otherwise support a means for transmitting, to the memory device, a second command associated with reading the set of data. In some examples, the input component 530 may be configured as or otherwise support a means for receiving, based at least in part on transmitting the second command, a second set of error control bits. In some examples, the error management component 535 may be configured as or otherwise support a means for comparing the value of the set of error control bits with a value of the second set of error control bits. In some examples, the error management component 535 may be configured as or otherwise support a means for determining that the set of error control bits fail the matching operation based at least in part on the value of the set of error control bits matching the value of the second set of error control bits.

Figure 6:
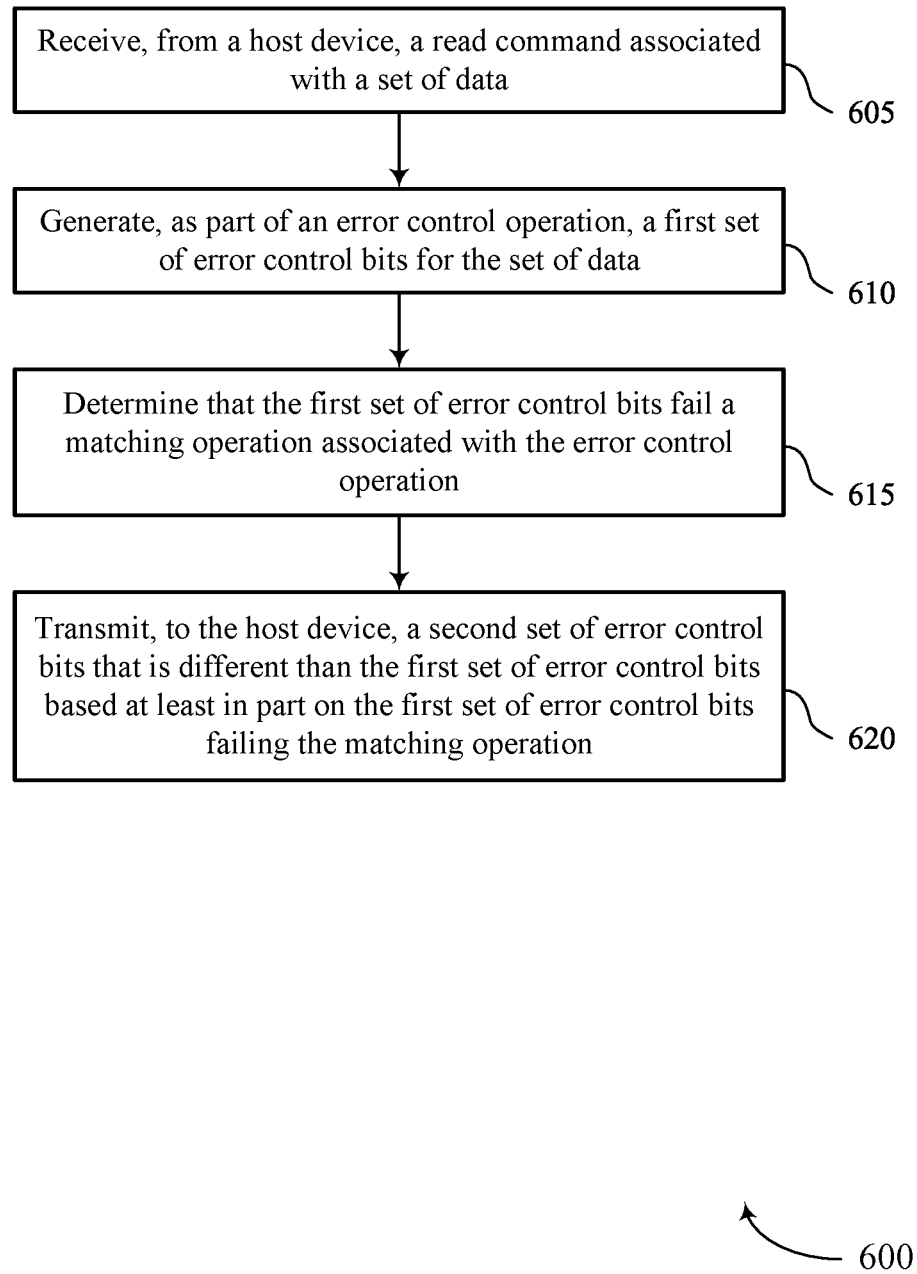
FIGS. 6 and 7 show flowcharts illustrating a method or methods that support real time syndrome check in accordance with examples as disclosed herein.

FIG. 6 shows a flowchart illustrating a method 600 that supports real time syndrome check in accordance with examples as disclosed herein. The operations of method 600 may be implemented by a memory device or its components as described herein. For example, the operations of method 600 may be performed by a memory device as described with reference to FIGS. 1 through 4. In some examples, a memory device may execute a set of instructions to control the functional elements of the device to perform the described functions. Additionally, or alternatively, the memory device may perform aspects of the described functions using special-purpose hardware.

At 605, the method may include receiving, from a host device, a read command associated with a set of data. The operations of 605 may be performed in accordance with examples as disclosed herein. In some examples, aspects of the operations of 605 may be performed by a command component 425 as described with reference to FIG. 4.

At 610, the method may include generating, as part of an error control operation, a first set of error control bits for the set of data. The operations of 610 may be performed in accordance with examples as disclosed herein. In some examples, aspects of the operations of 610 may be performed by an error management component 430 as described with reference to FIG. 4.

At 615, the method may include determining that the first set of error control bits fail a matching operation associated with the error control operation. The operations of 615 may be performed in accordance with examples as disclosed herein. In some examples, aspects of the operations of 615 may be performed by a syndrome check circuit 435 as described with reference to FIG. 4.

At 620, the method may include transmitting, to the host device, a second set of error control bits that is different than the first set of error control bits based at least in part on the first set of error control bits failing the matching operation. The operations of 620 may be performed in accordance with examples as disclosed herein. In some examples, aspects of the operations of 620 may be performed by an output component 440 as described with reference to FIG. 4.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving, from a host device, a read command associated with a set of data, generating, as part of an error control operation, a first set of error control bits for the set of data, determining that the first set of error control bits fail a matching operation associated with the error control operation, and transmitting, to the host device, a second set of error control bits that is different than the first set of error control bits based at least in part on the first set of error control bits failing the matching operation.

Some examples of the method 600 and the apparatus described herein may further include operations, features, circuitry, logic, means, or instructions for retrieving the second set of error control bits from a memory based at least in part on a failure of the matching operation, where transmitting the second set of error control bits may be based at least in part on retrieving the second set of error control bits.

In some examples of the method 600 and the apparatus described herein, determining that the first set of error control bits fail the matching operation may include operations, features, circuitry, logic, means, or instructions for comparing the first set of error control bits with a third set of error control bits stored for the set of data and determining that a value of the first set of error control bits may be different than a value of the third set of error control bits.

In some examples of the method 600 and the apparatus described herein, generating, based at least in part on a combination of the set of data and the second set of error control bits, a parity bit that indicates an even state or an odd state of the combination, inverting the parity bit based at least in part on the first set of error control bits failing the matching operation, and indicating, to the host device, that the first set of error control bits fail the matching operation based at least in part on the parity bit being inverted.

Some examples of the method 600 and the apparatus described herein may further include operations, features, circuitry, logic, means, or instructions for generating a second set of data based at least in part on the first set of error control bits failing the matching operation, each bit of the second set of data including a same logic value, transmitting the second set of data based at least in part on generating the second set of data, and indicating, to the host device, that the first set of error control bits fail the matching operation based at least in part on each bit of the second set of data including the same logic value.

Some examples of the method 600 and the apparatus described herein may further include operations, features, circuitry, logic, means, or instructions for disabling a mode associated with comparing syndrome bits based at least in part on a request received from the host device, where determining that the first set of error control bits fail the matching operation may be based at least in part on the mode associated with comparing the syndrome bits being enabled.

Some examples of the method 600 and the apparatus described herein may further include operations, features, circuitry, logic, means, or instructions for receiving, from the host device and based at least in part on disabling the mode, a second read command associated with the set of data, generating, as part of a second error control operation, the first set of error control bits for the set of data, and transmitting the set of data and the first set of error control bits based at least in part on generating the first set of error control bits.

In some examples of the method 600 and the apparatus described herein, the second set of error control bits indicates an uncorrectable error in the set of data.

In some examples of the method 600 and the apparatus described herein, the second set of error control bits may be associated with a non-aliasing error.

Figure 7:
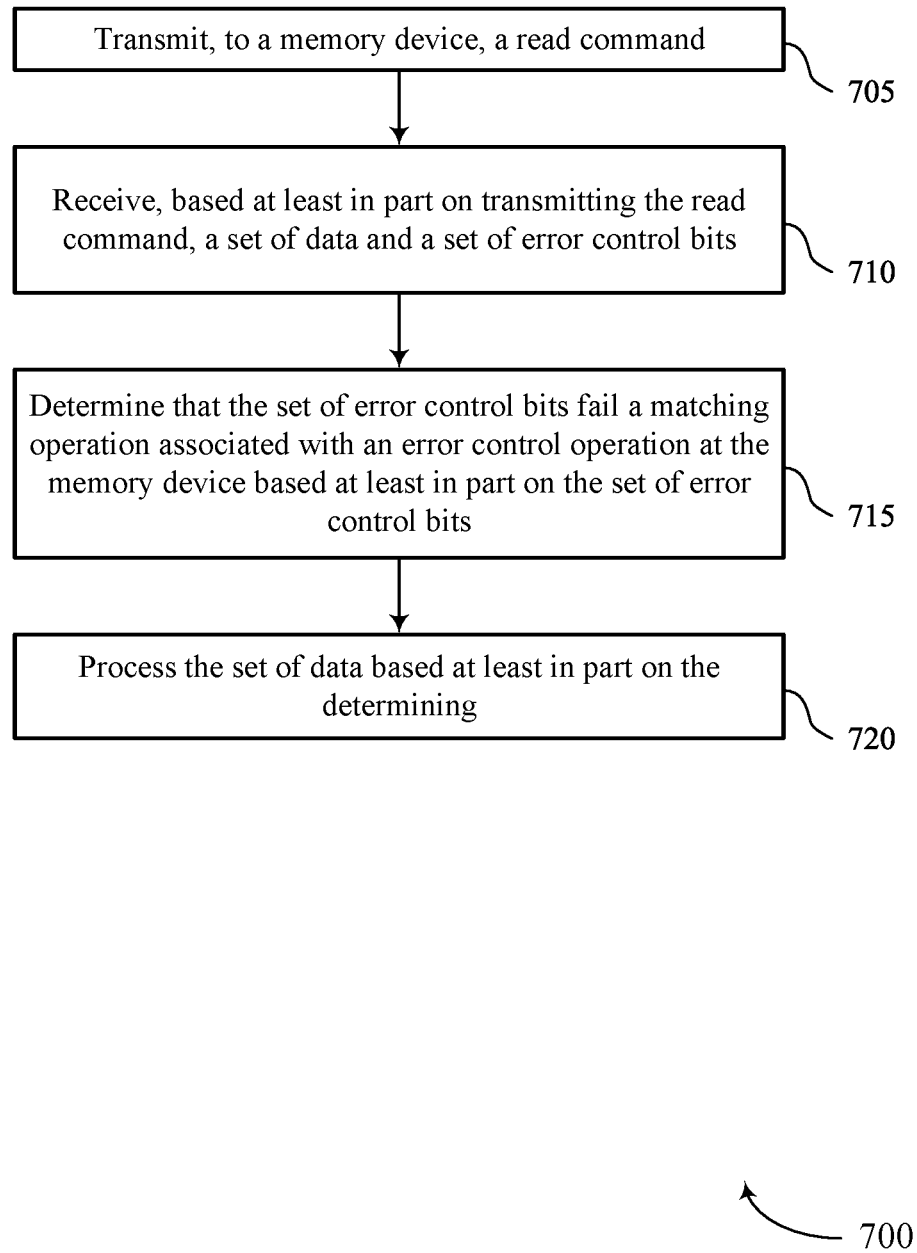

FIG. 7 shows a flowchart illustrating a method 700 that supports real time syndrome check in accordance with examples as disclosed herein. The operations of method 700 may be implemented by a host device or its components as described herein. For example, the operations of method 700 may be performed by a host device as described with reference to FIGS. 1 through 3 and 5. In some examples, a host device may execute a set of instructions to control the functional elements of the device to perform the described functions. Additionally, or alternatively, the host device may perform aspects of the described functions using special-purpose hardware.

At 705, the method may include transmitting, to a memory device, a read command. The operations of 705 may be performed in accordance with examples as disclosed herein. In some examples, aspects of the operations of 705 may be performed by a command component 525 as described with reference to FIG. 5.

At 710, the method may include receiving, based at least in part on transmitting the read command, a set of data and a set of error control bits. The operations of 710 may be performed in accordance with examples as disclosed herein. In some examples, aspects of the operations of 710 may be performed by an input component 530 as described with reference to FIG. 5.

At 715, the method may include determining that the set of error control bits fail a matching operation associated with an error control operation at the memory device based at least in part on the set of error control bits. The operations of 715 may be performed in accordance with examples as disclosed herein. In some examples, aspects of the operations of 715 may be performed by an error management component 535 as described with reference to FIG. 5.

At 720, the method may include processing the set of data based at least in part on the determining. The operations of 720 may be performed in accordance with examples as disclosed herein. In some examples, aspects of the operations of 720 may be performed by a data component 540 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for transmitting, to a memory device, a read command, receiving, based at least in part on transmitting the read command, a set of data and a set of error control bits, determining that the set of error control bits fail a matching operation associated with an error control operation at the memory device based at least in part on the set of error control bits, and processing the set of data based at least in part on the determining.

In some examples of the method 700 and the apparatus described herein, processing the set of data may include operations, features, circuitry, logic, means, or instructions for discarding the set of data based at least in part on determining that the set of error control bits fail the matching operation.

Some examples of the method 700 and the apparatus described herein may further include operations, features, circuitry, logic, means, or instructions for determining that the set of data includes an uncorrectable error based at least in part on determining that the set of error control bits fail the matching operation.

Some examples of the method 700 and the apparatus described herein may further include operations, features, circuitry, logic, means, or instructions for comparing a value of the set of error control bits with a stored value associated with the matching operation, where determining that the set of error control bits fail the matching operation based at least in part on the value of the set of error control bits matching the stored value.

Some examples of the method 700 and the apparatus described herein may further include operations, features, circuitry, logic, means, or instructions for decoding a first parity bit that indicates an even state or an odd state of a combination of the set of data and the set of error control bits, generating, based at least in part on the set of data and the set of error control bits, a second parity bit associated with indicating the even state or the odd state of the combination of the set of data and the set of error control bits, and comparing the first parity bit with the second parity bit.

Some examples of the method 700 and the apparatus described herein may further include operations, features, circuitry, logic, means, or instructions for determining that the set of error control bits fail the matching operation based at least in part on a value of the first parity bit being different than a value of the second parity bit.

Some examples of the method 700 and the apparatus described herein may further include operations, features, circuitry, logic, means, or instructions for receiving the set of data based at least in part on transmitting the read command and determining, based at least in part on receiving the set of data, that the set of error control bits indicates an error in the set of data based at least in part on a value of the first parity bit matching a value of the second parity bit.

In some examples of the method 700 and the apparatus described herein, the read command may be associated with a second set of data stored at the memory device and the method, apparatuses, and non-transitory computer-readable medium may include further operations, features, circuitry, logic, means, or instructions for comparing a value of the set of error control bits with a stored value, determining that each bit of the set of data includes a same logic value, and determining that the set of error control bits fail the matching operation based at least in part on the value of the set of error control bits matching the stored value and each bit of the set of data including the same logic value.

Some examples of the method 700 and the apparatus described herein may further include operations, features, circuitry, logic, means, or instructions for comparing a value of the set of error control bits with a stored value, determining that the value of the set of error control bits matches the stored value, and transmitting, to the memory device, a request to disable a mode associated with comparing syndrome bits.

Some examples of the method 700 and the apparatus described herein may further include operations, features, circuitry, logic, means, or instructions for transmitting, to the memory device, a second command associated with reading the set of data, receiving, based at least in part on transmitting the second command, a second set of error control bits, comparing the value of the set of error control bits with a value of the second set of error control bits, and determining that the set of error control bits fail the matching operation based at least in part on the value of the set of error control bits matching the value of the second set of error control bits.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory array including an array of memory cells that each include capacitive storage elements, a circuit coupled with the memory array and configured to cause the apparatus to, receive, from a host device, a read command associated with a set of data, generate, as part of an error control operation, a first set of error control bits for the set of data, determine that the first set of error control bits fail a matching operation associated with the error control operation, and transmit, to the host device, a second set of error control bits that is different than the first set of error control bits based at least in part on the first set of error control bits failing the matching operation.

In some examples, the circuit is configured to cause the apparatus to retrieve the second set of error control bits from a memory based at least in part on a failure of the matching operation, where transmitting the second set of error control bits may be based at least in part on retrieving the second set of error control bits.

In some examples, to determine that the first set of error control bits fail the matching operation, the circuit is configured to cause the apparatus to compare the first set of error control bits with a third set of error control bits stored for the set of data and determine that a value of the first set of error control bits may be different than a value of the third set of error control bits.

In some examples of the apparatus, the circuit may be further configured to cause the apparatus to generate, based at least in part on a combination of the set of data and the second set of error control bits, a parity bit that indicates an even state or an odd state of the combination, invert the parity bit based at least in part on the first set of error control bits failing the matching operation, and indicate, to the host device, that the first set of error control bits fail the matching operation based at least in part on the parity bit being inverted.

In some examples, the circuit is configured to cause the apparatus to generate a second set of data based at least in part on the first set of error control bits failing the matching operation, each bit of the second set of data including a same logic value, transmit the second set of data based at least in part on generating the second set of data, and indicate, to the host device, that the first set of error control bits fail the matching operation based at least in part on each bit of the second set of data including the same logic value.

In some examples, the circuit is configured to cause the apparatus to disable a mode associated with comparing syndrome bits based at least in part on a request received from the host device, where determining that the first set of error control bits fail the matching operation may be based at least in part on the mode associated with comparing the syndrome bits being enabled.

Another apparatus is described. The apparatus may include a circuit configured to cause the apparatus to, transmit, to a memory device, a read command, receive, based at least in part on transmitting the read command, a set of data and a set of error control bits, determine that the set of error control bits fail a matching operation associated with an error control operation at the memory device based at least in part on the set of error control bits, and process the set of data based at least in part on the determining.

In some examples, the circuit is configured to cause the apparatus to discard the set of data based at least in part on determining that the set of error control bits fail the matching operation.

In some examples, the circuit is configured to cause the apparatus to determine that the set of data includes an uncorrectable error based at least in part on determining that the set of error control bits fail the matching operation.

In some examples, the circuit is configured to cause the apparatus to compare a value of the set of error control bits with a stored value associated with the matching operation, where determining that the set of error control bits fail the matching operation based at least in part on the value of the set of error control bits matching the stored value.

In some examples of the apparatus, the circuit may be further configured to cause the apparatus to decode a first parity bit that indicates an even state or an odd state of a combination of the set of data and the set of error control bits, generate, based at least in part on the set of data and the set of error control bits, a second parity bit associated with indicating the even state or the odd state of the combination of the set of data and the set of error control bits, and compare the first parity bit with the second parity bit.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, from a host device, a read command associated with a set of data;
   generating, as part of an error control operation, a first set of error control bits for the set of data, wherein the first set of error control bits are associated with indicating to the host device whether one or more errors is introduced into the set of data during transmission of the set of data to the host device;
   determining, during a matching operation associated with the error control operation, that the first set of error control bits is different than a third set of error control bits stored for the set of data; and
   transmitting, to the host device on a channel, and during a duration, for transmitting the first set of error control bits, a second set of error control bits that is different than the first set of error control bits instead based at least in part on the first set of error control bits being different than the third set of error control bits, wherein the second set of error control bits are associated with indicating to the host device a failure of the matching operation.

2. The method of claim 1, further comprising:
   retrieving the second set of error control bits from a memory based at least in part on the failure of the matching operation, wherein transmitting the second set of error control bits is based at least in part on retrieving the second set of error control bits.

3. The method of claim 1, wherein determining that the first set of error control bits fail the matching operation comprises:
   comparing the first set of error control bits with the third set of error control bits stored for the set of data; and
   determining that a value of the first set of error control bits is different than a value of the third set of error control bits.

4. The method of claim 1, further comprising:
   generating, based at least in part on a combination of the set of data and the second set of error control bits, a parity bit that indicates an even state or an odd state of the combination;
   inverting the parity bit based at least in part on the first set of error control bits failing the matching operation; and
   indicating, to the host device, that the first set of error control bits fail the matching operation based at least in part on the parity bit being inverted.

5. The method of claim 1, further comprising:
   generating a second set of data based at least in part on the first set of error control bits failing the matching operation, each bit of the second set of data comprising a same logic value;
   transmitting the second set of data based at least in part on generating the second set of data; and
   indicating, to the host device, that the first set of error control bits fail the matching operation based at least in part on each bit of the second set of data comprising the same logic value.

6. A method, comprising:
   receiving, from a host device, a read command associated with a set of data;
   generating, as part of an error control operation, a first set of error control bits for the set of data;
   determining that the first set of error control bits fail a matching operation associated with the error control operation;
   transmitting, to the host device, a second set of error control bits that is different than the first set of error control bits based at least in part on the first set of error control bits failing the matching operation; and
   disabling a mode associated with comparing syndrome bits based at least in part on a request received from the host device, wherein determining that the first set of error control bits fail the matching operation is based at least in part on the mode associated with comparing syndrome bits being enabled.

7. The method of claim 6, further comprising:
   receiving, from the host device and based at least in part on disabling the mode associated with comparing syndrome bits, a second read command associated with the set of data;
   generating, as part of a second error control operation, the first set of error control bits for the set of data; and
   transmitting the set of data and the first set of error control bits based at least in part on generating the first set of error control bits.

8. The method of claim 1, wherein the second set of error control bits indicates an uncorrectable error in the set of data.

9. The method of claim 1, wherein the second set of error control bits is associated with a non-aliasing error.

10. A method, comprising:
    transmitting, to a memory device, a read command;
    receiving, based at least in part on transmitting the read command, a set of data and a set of error control bits on a channel, and during a duration, for receiving error control bits indicating whether one or more errors were introduced into the set of data during a transmission of the set of data;
    determining that a matching operation associated with an error control operation failed at the memory device instead of determining whether one or more errors were introduced into the set of data during the transmission based at least in part on the set of error control bits; and
    processing the set of data based at least in part on the determining.

11. The method of claim 10, wherein processing the set of data comprises:
    discarding the set of data based at least in part on determining that the set of error control bits fail the matching operation.

12. The method of claim 10, further comprising:
    determining that the set of data comprises an uncorrectable error based at least in part on determining that the set of error control bits fail the matching operation.

13. The method of claim 10, further comprising:
    comparing a value of the set of error control bits with a stored value associated with the matching operation, wherein determining that the set of error control bits fail the matching operation based at least in part on the value of the set of error control bits matching the stored value.

14. The method of claim 10, further comprising:
    decoding a first parity bit that indicates an even state or an odd state of a combination of the set of data and the set of error control bits;
    generating, based at least in part on the set of data and the set of error control bits, a second parity bit associated with indicating the even state or the odd state of the combination of the set of data and the set of error control bits; and
    comparing the first parity bit with the second parity bit.

15. The method of claim 14, further comprising:
determining that the set of error control bits fail the matching operation based at least in part on a value of the first parity bit being different than a value of the second parity bit.

16. The method of claim 14, further comprising:
receiving the set of data based at least in part on transmitting the read command; and
determining, based at least in part on receiving the set of data, that the set of error control bits indicates an error in the set of data based at least in part on a value of the first parity bit matching a value of the second parity bit.

17. The method of claim 10, wherein the read command is associated with a second set of data stored at the memory device, the method further comprising:
comparing a value of the set of error control bits with a stored value;
determining that each bit of the set of data comprises a same logic value; and
determining that the set of error control bits fail the matching operation based at least in part on the value of the set of error control bits matching the stored value and each bit of the set of data comprising the same logic value.

18. A method, comprising:
transmitting, to a memory device, a read command;
receiving, based at least in part on transmitting the read command, a set of data and a set of error control bits;
determining that the set of error control bits fail a matching operation associated with an error control operation at the memory device based at least in part on the set of error control bits;
processing the set of data based at least in part on the determining;
comparing a value of the set of error control bits with a stored value;
determining that the value of the set of error control bits matches the stored value; and
transmitting, to the memory device, a request to disable a mode associated with comparing syndrome bits.

19. The method of claim 18, further comprising:
transmitting, to the memory device, a second command associated with reading the set of data;
receiving, based at least in part on transmitting the second command, a second set of error control bits;
comparing the value of the set of error control bits with a value of the second set of error control bits; and
determining that the set of error control bits fail the matching operation based at least in part on the value of the set of error control bits matching the value of the second set of error control bits.

20. An apparatus, comprising:
a memory array comprising an array of memory cells that each comprise capacitive storage elements; and
a circuit coupled with the memory array and configured to cause the apparatus to:
receive, from a host device, a read command associated with a set of data;
generate, as part of an error control operation, a first set of error control bits for the set of data, wherein the first set of error control bits are associated with indicating to the host device whether one or more errors is introduced into the set of data during transmission of the set of data to the host device;
determine, during a matching operation associated with the error control operation, that the first set of error control bits is different than a third set of error control bits stored for the set of data; and
transmit, to the host device on a channel, and during a duration, for transmitting the first set of error control bits, a second set of error control bits that is different than the first set of error control bits instead based at least in part on the first set of error control bits being different than the third set of error control bits, wherein the second set of error control bits are associated with indicating to the host device a failure of the matching operation.

21. The apparatus of claim 20, wherein the circuit is further configured to cause the apparatus to:
retrieve the second set of error control bits from a memory based at least in part on the failure of the matching operation, wherein transmitting the second set of error control bits is based at least in part on retrieving the second set of error control bits.

22. The apparatus of claim 20, wherein, to determine that the first set of error control bits fail the matching operation, the circuit is further configured to cause the apparatus to:
compare the first set of error control bits with the third set of error control bits stored for the set of data; and
determine that a value of the first set of error control bits is different than a value of the third set of error control bits.

23. The apparatus of claim 20, wherein the circuit is further configured to cause the apparatus to:
generate, based at least in part on a combination of the set of data and the second set of error control bits, a parity bit that indicates an even state or an odd state of the combination;
invert the parity bit based at least in part on the first set of error control bits failing the matching operation; and
indicate, to the host device, that the first set of error control bits fail the matching operation based at least in part on the parity bit being inverted.

24. The apparatus of claim 20, wherein the circuit is further configured to cause the apparatus to:
generate a second set of data based at least in part on the first set of error control bits failing the matching operation, each bit of the second set of data comprising a same logic value;
transmit the second set of data based at least in part on generating the second set of data; and
indicate, to the host device, that the first set of error control bits fail the matching operation based at least in part on each bit of the second set of data comprising the same logic value.

25. The apparatus of claim 20, wherein the circuit is further configured to cause the apparatus to:
disable a mode associated with comparing syndrome bits based at least in part on a request received from the host device, wherein determining that the first set of error control bits fail the matching operation is based at least in part on the mode associated with comparing syndrome bits being enabled.

26. An apparatus, comprising:
a circuit configured to cause the apparatus to:
transmit, to a memory device, a read command;
receive, based at least in part on transmitting the read command, a set of data and a set of error control bits on a channel, and during a duration, for receiving error control bits indicating whether one or more errors were introduced into the set of data during a transmission of the set of data;

determine that a matching operation associated with an error control operation failed at the memory device instead of determining whether one or more errors were introduced into the set of data during the transmission based at least in part on the set of error control bits; and process the set of data based at least in part on the determining.

27. The apparatus of claim 26, wherein the circuit is further configured to cause the apparatus to:

discard the set of data based at least in part on determining that the set of error control bits fail the matching operation.

28. The apparatus of claim 26, wherein the circuit is further configured to cause the apparatus to:

determine that the set of data comprises an uncorrectable error based at least in part on determining that the set of error control bits fail the matching operation.

29. The apparatus of claim 26, wherein the circuit is further configured to cause the apparatus to:

compare a value of the set of error control bits with a stored value associated with the matching operation, wherein determining that the set of error control bits fail the matching operation based at least in part on the value of the set of error control bits matching the stored value.

30. The apparatus of claim 26, wherein the circuit is further configured to cause the apparatus to:

decode a first parity bit that indicates an even state or an odd state of a combination of the set of data and the set of error control bits;

generate, based at least in part on the set of data and the set of error control bits, a second parity bit associated with indicating the even state or the odd state of the combination of the set of data and the set of error control bits; and compare the first parity bit with the second parity bit.

31. A non-transitory computer-readable medium comprising instructions which, when executed by a processor of an electronic device, cause the electronic device to:

receive, from a host device, a read command associated with a set of data;

generate, as part of an error control operation, a first set of error control bits for the set of data, wherein the first set of error control bits are associated with indicating to the host device whether one or more errors is introduced into the set of data during transmission of the set of data to the host device;

determine, during a matching operation associated with the error control operation, that the first set of error control bits is different than a third set of error control bits stored for the set of data; and transmit, to the host device on a channel, and during a duration, for transmitting the first set of error control bits, a second set of error control bits that is different than the first set of error control bits instead based at least in part on the first set of error control bits being different than the third set of error control bits, wherein the second set of error control bits are associated with indicating to the host device a failure of the matching operation.

32. The non-transitory computer-readable medium of claim 31, wherein the instructions are further executable by the processor to cause the electronic device to:

retrieve the second set of error control bits from a memory based at least in part on the failure of the matching operation, wherein transmitting the second set of error control bits is based at least in part on retrieving the second set of error control bits.

33. The non-transitory computer-readable medium of claim 31, wherein the instructions are further executable by the processor to cause the electronic device to:

generate, based at least in part on a combination of the set of data and the second set of error control bits, a parity bit that indicates an even state or an odd state of the combination;

invert the parity bit based at least in part on the first set of error control bits failing the matching operation; and indicate, to the host device, that the first set of error control bits fail the matching operation based at least in part on the parity bit being inverted.

34. The non-transitory computer-readable medium of claim 31, wherein the instructions are further executable by the processor to cause the electronic device to:

generate a second set of data based at least in part on the first set of error control bits failing the matching operation, each bit of the second set of data comprising a same logic value;

transmit the second set of data based at least in part on generating the second set of data; and indicate, to the host device, that the first set of error control bits fail the matching operation based at least in part on each bit of the second set of data comprising the same logic value.

35. The non-transitory computer-readable medium of claim 31, wherein the instructions are further executable by the processor to cause the electronic device to:

disable a mode associated with comparing syndrome bits based at least in part on a request received from the host device, wherein determining that the first set of error control bits fail the matching operation is based at least in part on the mode associated with comparing syndrome bits being enabled.

* * * * *